(12) United States Patent
Perez et al.

(10) Patent No.: US 10,864,733 B2
(45) Date of Patent: Dec. 15, 2020

(54) INKJET PRINTHEAD WITH ENCAPSULANT-RETAINING FEATURES

(71) Applicant: MEMJET TECHNOLOGY LIMITED, Dublin (IE)

(72) Inventors: Elmer Dimaculangan Perez, North Ryde (AU); Angus North, North Ryde (AU); Graeme Lowe, North Ryde (AU); See-Huat Tan, North Ryde (AU); Christopher Barton, North Ryde (AU)

(73) Assignee: Memjet Technology Limited

( * ) Notice: Subject to any disclaimer, the term of this patent is extended or adjusted under 35 U.S.C. 154(b) by 0 days.

(21) Appl. No.: 16/400,949

(22) Filed: May 1, 2019

(65) Prior Publication Data
US 2019/0337291 A1    Nov. 7, 2019

Related U.S. Application Data

(60) Provisional application No. 62/666,296, filed on May 3, 2018.

(51) Int. Cl.
*B41J 2/045* (2006.01)
*B41J 2/14* (2006.01)
(Continued)

(52) U.S. Cl.
CPC ........... *B41J 2/145* (2013.01); *B41J 2/04541* (2013.01); *B41J 2/14024* (2013.01);
(Continued)

(58) Field of Classification Search
CPC ............... B41J 2/04541; B41J 2/14024; B41J 2/14072; B41J 2/14427; B41J 2/145;
(Continued)

(56) References Cited

U.S. PATENT DOCUMENTS 5,519,421 A  *  5/1996  Barr ..................... B41J 2/14024
                                                    347/47
5,530,278 A  *  6/1996  Jedicka ............... H01L 23/3157
                                                    250/227.23
(Continued)

FOREIGN PATENT DOCUMENTS

| EP | 0 694 399 A1 | 1/1996 |
| EP | 0 822 077 A2 | 2/1998 |
| WO | WO-2006/062244 A1 | 6/2006 |

OTHER PUBLICATIONS

International Search Report dated Jul. 10, 2019, for PCT Application No. PCT/EP2019/059174, filed on Apr. 11, 2019, 4 pages.
(Continued)

*Primary Examiner* — Anh T Vo
(74) *Attorney, Agent, or Firm* — Cooley LLP

(57) ABSTRACT

A MEMS chip assembly including: a support structure having a chip mounting surface; a MEMS chip mounted on the chip mounting surface, each MEMS chip having an active surface including one or more MEMS devices and a plurality of bond pads disposed alongside a connection edge of the MEMS chip; electrical connectors connected to the bond pads; and an encapsulant material covering the electrical connectors. The MEMS chip has encapsulant-retaining trenches defined in the active surface extending alongside the connection edge, each encapsulant-retaining trench being disposed between the bond pads and the MEMS devices.

16 Claims, 3 Drawing Sheets

(51) Int. Cl.
*B81B 7/00* (2006.01)
*B41J 2/145* (2006.01)
*B41J 2/16* (2006.01)

(52) U.S. Cl.
CPC ......... *B41J 2/14072* (2013.01); *B41J 2/1601* (2013.01); *B81B 7/0032* (2013.01); *B41J 2202/15* (2013.01); *B81B 2201/052* (2013.01)

(58) Field of Classification Search
CPC .. B41J 2/1601; B41J 2202/15; B41J 2202/20; B41J 2002/14491; B81B 7/0032; B81B 2201/052
See application file for complete search history.

(56) References Cited

U.S. PATENT DOCUMENTS

| | | | | |
|---|---|---|---|---|
| 6,099,109 | A | * | 8/2000 | Komuro ............... B41J 2/14024 347/50 |
| 2006/0139410 | A1 | * | 6/2006 | Kawamura .......... B41J 2/14024 347/58 |

OTHER PUBLICATIONS

Written Opinion of the International Searching Authority dated Jul. 10, 2019, for PCT Application No. PCT/EP2019/059174, filed on Apr. 11, 2019, 9 pages.

\* cited by examiner

INKJET PRINTHEAD WITH ENCAPSULANT-RETAINING FEATURES

CROSS-REFERENCE TO RELATED APPLICATIONS

The present application claims the benefit of priority under 35 U.S.C. § 119(e) of U.S. Provisional Application No. 62/666,296, entitled INKJET PRINTHEAD WITH GROUT AND ENCAPSULANT-RETAINING FEATURES, filed May 3, 2018, the contents of which are incorporated herein by reference in it's entirety for all purposes.

FIELD OF THE INVENTION

This invention relates to a MEMS chip assembly, such as an inkjet printhead assembly. It has been developed primarily to increase yields of such assemblies by controlling encroachment of encapsulants (covering electrical connections) onto the MEMS chip surface.

BACKGROUND OF THE INVENTION

The Applicant has developed a range of Memjet® inkjet printers as described in, for example, WO2011/143700, WO2011/143699 and WO2009/089567, the contents of which are herein incorporated by reference. Memjet® printers employ a stationary printhead in combination with a feed mechanism which feeds print media past the printhead in a single pass. Memjet® printers therefore provide much higher printing speeds than conventional scanning inkjet printers.

Memjet® printheads are generally fabricated by mounting printhead chips on a suitable fluid manifold and then forming electrical connections to bond pads arranged along an edge region of the printhead chip. For example, U.S. Pat. No. 7,347,534 (the contents of which are incorporated herein by reference) describes a pagewide printhead fabricated by mounting printhead chips to a liquid crystal polymer (LCP) manifold. The printhead chips are mounted to the LCP manifold in a butting arrangement via an apertured die-attach film, and the LCP manifold cooperates with the die-attach film to direct ink from ink channels in the manifold to respective color planes of printhead chip via a series of tortuous ink paths. As described in U.S. Pat. No. 7,347,534, electrical connections to the printhead chips are formed via wirebonding to bond pads on the chips with subsequent encapsulation of the wirebonds. In other inkjet printheads, tape-automated bonding (TAB) is used for forming electrical connection to printhead chips.

The manifold on which the printhead chips are mounted may be formed of any suitable polymer or metal substrate. For example, in the printhead described in U.S. application Ser. No. 15/888,852 filed 5 Feb. 2018 (the contents of which are incorporated herein by reference), a plurality of butting printhead chips are mounted to an Invar fluid manifold via an Invar shim bonded to the manifold.

Electrical connections to MEMS chips, such as printhead chips, are usually via wirebonding or tape-automated bonding (TAB) to bond pads positioned along an edge region of the chip. After forming the electrical connections, the bond pads are then covered with a protective encapsulant material. The encapsulant material is typically a liquid polymer applied as a bead over the bond pads and electrical connectors (e.g. wirebonds), whereby curing and hardening of the encapsulant provides a robust protective coating. A degree of compliance in the cured encapsulant may be desirable to accommodate thermal expansion and contraction of the MEMS chips relative to a supporting structure.

A perennial problem in applying encapsulant to MEMS chips is that the liquid encapsulant tends to migrate over a surface of the chip from an edge region (where it is required) towards the MEMS devices on the surface of the chip. Usually, if the MEMS devices (e.g. inkjet nozzle devices) are covered with encapsulant, then the MEMS chip is irreparably damaged, reducing manufacturing yields.

The prior art describes a number of measures for minimizing encroachment of an encapsulant material into a vicinity of MEMS devices.

For example, U.S. Pat. No. 5,530,278 describes formation of a dam wall on the surface of the chip, which provides a physical barrier against an advancing liquid front of encapsulant material. However, a dam wall projecting from the surface of the chip is undesirable in the case of printhead chips, because the ink ejection surface needs to be wiped periodically during use and surface projections tend to damage the wiper.

U.S. Pat. No. 7,659,141, the contents of which are incorporated herein by reference, describes a method of applying encapsulant to a printhead chip, whereby a temporary baffle structure is used to control migration of the liquid encapsulant.

It would be desirable to provide an effective means of controlling migration of liquid encapsulant across a surface of a chip, which does not rely on surface projections that act as a physical barrier for the migrating encapsulant. It would be further desirable to provide a means of grouting between butting printhead chips, such that migration of liquid grout material across inkjet nozzles is minimized.

SUMMARY OF THE INVENTION

According to a first aspect, there is provided a MEMS chip assembly comprising:
   a support structure having a chip mounting surface;
   a MEMS chip mounted on the chip mounting surface, each MEMS chip having an active surface including one or more MEMS devices and a plurality of bond pads disposed alongside a connection edge of the MEMS chip;
   electrical connectors connected to the bond pads; and
   an encapsulant material covering the electrical connectors,
wherein the MEMS chip has one or more encapsulant-retaining trenches defined in the active surface extending alongside the connection edge, each encapsulant-retaining trench being disposed between the bond pads and the MEMS devices,
and wherein the encapsulant material does not encroach past the encapsulant-retaining trenches towards the MEMS devices.

The electrical connectors may comprise wirebonds or TAB connections.

Preferably, multiple rows of encapsulant-retaining trenches are disposed between the bond pads and the MEMS devices.

Preferably, the rows of encapsulant-retaining trenches extend parallel with the connection edge. However, it will be appreciated that alternative encapsulant-retaining trench patterns (e.g. zig-zag, sinusoidal etc) are within the ambit of the present invention.

Preferably, each encapsulant-retaining trench has a depth in the range of 2 to 10 microns. Thus, the encapsulant-retaining trenches are not required to have a depth sufficient to act as a moat for holding excess encapsulant material; rather, the encapsulant-retaining trenches function by pinning an advancing front of encapsulant material against a leading (upstream) edge of the encapsulant-retaining trench as will be described in more detail below.

Moreover, the encapsulant-retaining trenches are shallow relative to the overall thickness of the chip, such that they have minimal impact on the overall structural integrity of the chip. Typically, a ratio of the overall thickness of the chip to the encapsulant-retaining trench depth is at least 20:1 or at least 30:1.

Preferably, each encapsulant-retaining trench has a width in the range of 2 to 20 microns, such that they have minimal impact on the overall structural integrity of the chip.

Preferably, multiple rows of encapsulant-retaining trenches are disposed between the bond pads and the MEMS devices. Preferably, the rows of encapsulant-retaining trenches are spaced apart from each other by 4 to 20 microns so as to minimize any reduction in the structural integrity of the chip. Preferably, a distance between neighboring encapsulant-retaining trenches is greater than a width of each encapsulant-retaining trench.

Preferably, each encapsulant-retaining trench has a rectangular profile in cross-section.

Preferably, the encapsulant material is a crosslinkable polymer applied as a liquid during encapsulation. For example, the liquid polymer may be crosslinkable via UV/and/or thermal curing.

In one embodiment, the MEMS devices are inkjet nozzle devices and the support structure is a fluid manifold for delivering ink to the inkjet nozzle devices.

In a related aspect, there is provided a MEMS chip comprising a substrate having an active surface, the active surface including a plurality of MEMS devices, a plurality of bond pads arranged alongside a connection edge of the substrate and one or more encapsulant-retaining trenches defined therein, wherein the encapsulant-retaining trenches extend alongside the connection edge and each encapsulant-retaining trench is disposed between the bond pads and the MEMS devices.

In another related aspect, there is provided a method of fabricating a MEMS chip assembly, the method comprising the steps of:

mounting a MEMS chip to a chip mounting surface of a support structure, each MEMS chip comprising a substrate having an active surface, the active surface including a plurality of MEMS devices, a plurality of bond pads arranged alongside a connection edge of the substrate and one or more encapsulant-retaining trenches defined therein, wherein the encapsulant-retaining trenches extend alongside the connection edge and each encapsulant-retaining trench is disposed between the bond pads and the MEMS devices;

connecting electrical connectors to the plurality of bond pads;

applying one or more beads of liquid encapsulant material over the electrical connectors;

pinning an advancing liquid front of the encapsulant material at an edge of one of the encapsulant-retaining trenches defined in the active surface; and curing the encapsulant material.

Preferably, the or each encapsulant-retaining trench minimizes encroachment of the encapsulant material onto the MEMS devices.

In one embodiment, the MEMS chip is a printhead chip and the MEMS chip assembly is an inkjet printhead.

In a second aspect, there is provided an inkjet printhead comprising:

an elongate support having a printhead mounting surface;

a plurality of butting printhead chips mounted on the printhead mounting surface, each printhead chip having an ink ejection surface including one or more nozzle rows; and a grout material disposed between butting edges of each butting pair of printhead chips, wherein each printhead chip has a grouting trench defined in the ink ejection surface, the grouting trench extending alongside at least one butting edge and the grouting trench being disposed between an endmost nozzle of each nozzle row and the butting edge.

Preferably, the grouting trench extends parallel with the butting edge.

Preferably, each butting edge of each printhead chip has a corresponding grouting trench extending alongside the respective butting edge.

Preferably, the grouting trench has a depth in the range of 2 to 10 microns so as minimize any impact on the structural integrity of the chip. Preferably, the grouting trench has a width in the range of 2 to 20 microns.

Preferably, the printhead chips are mounted to the elongate support either directly or via a film layer.

Preferably, the elongate support comprises a fluid manifold having a plurality of fluid outlets for delivering ink to the printhead chips.

Preferably, the butting edges are non-perpendicular to a longitudinal edge of the printhead chip.

Preferably, the grout material is a cross-linked polymer applied as a liquid during grouting.

In a related aspect, there is provided an inkjet printhead chip comprising a substrate having an ink ejection surface including one or more nozzle rows and a grouting trench defined in the ink ejection surface, wherein the grouting trench extends alongside at least one end edge of the substrate and the grouting trench is disposed between an endmost nozzle of each nozzle row and the end edge.

Preferably, the end edge is configured for butting with corresponding printhead chips.

In a related aspect, there is provided a method of fabricating an inkjet printhead, the method comprising the steps of:

mounting a plurality of printhead chips in a butting arrangement on a printhead mounting surface of an elongate support, each printhead chip having an ink ejection surface including one or more nozzle rows and a grouting trench defined therein, wherein the grouting trench extends alongside at least one butting edge of the printhead chip and the grouting trench is disposed between an endmost nozzle of each nozzle row and the butting edge;

flowing a grout material into a space defined between the butting edges of the printhead chips;

pinning an advancing liquid front of the grout material at an edge of a grouting trench defined in the ink ejection surface; and curing the grout material.

Preferably, the grout material is introduced alongside a longitudinal edge of at least one printhead chips, the grout material thereby flowing into spaces defined between the butting edges of the printhead chips.

Preferably, the longitudinal edge is opposite a longitudinal edge of the printhead chip containing electrical connections.

Preferably, the grouting trench minimizes encroachment of the grout material into nozzles of the printhead.

It will of course be appreciated that preferred embodiments of the invention described above in connection with the first, second and related aspects are equally applicable to any aspect of the invention, where relevant.

As used herein, the term "ink" is taken to mean any printing fluid, which may be printed from an inkjet printhead. The ink may or may not contain a colorant. Accordingly, the term "ink" may include conventional dye-based or pigment based inks, infrared inks, fixatives (e.g. pre-coats and finishers), 3D printing fluids and the like.

As used herein, the term "mounted" includes both direct mounting and indirect mounting via an intervening part.

BRIEF DESCRIPTION OF THE DRAWINGS

Embodiments of the present invention will now be described by way of example only with reference to the accompanying drawings, in which.

DETAILED DESCRIPTION OF THE INVENTION

Figure 1:
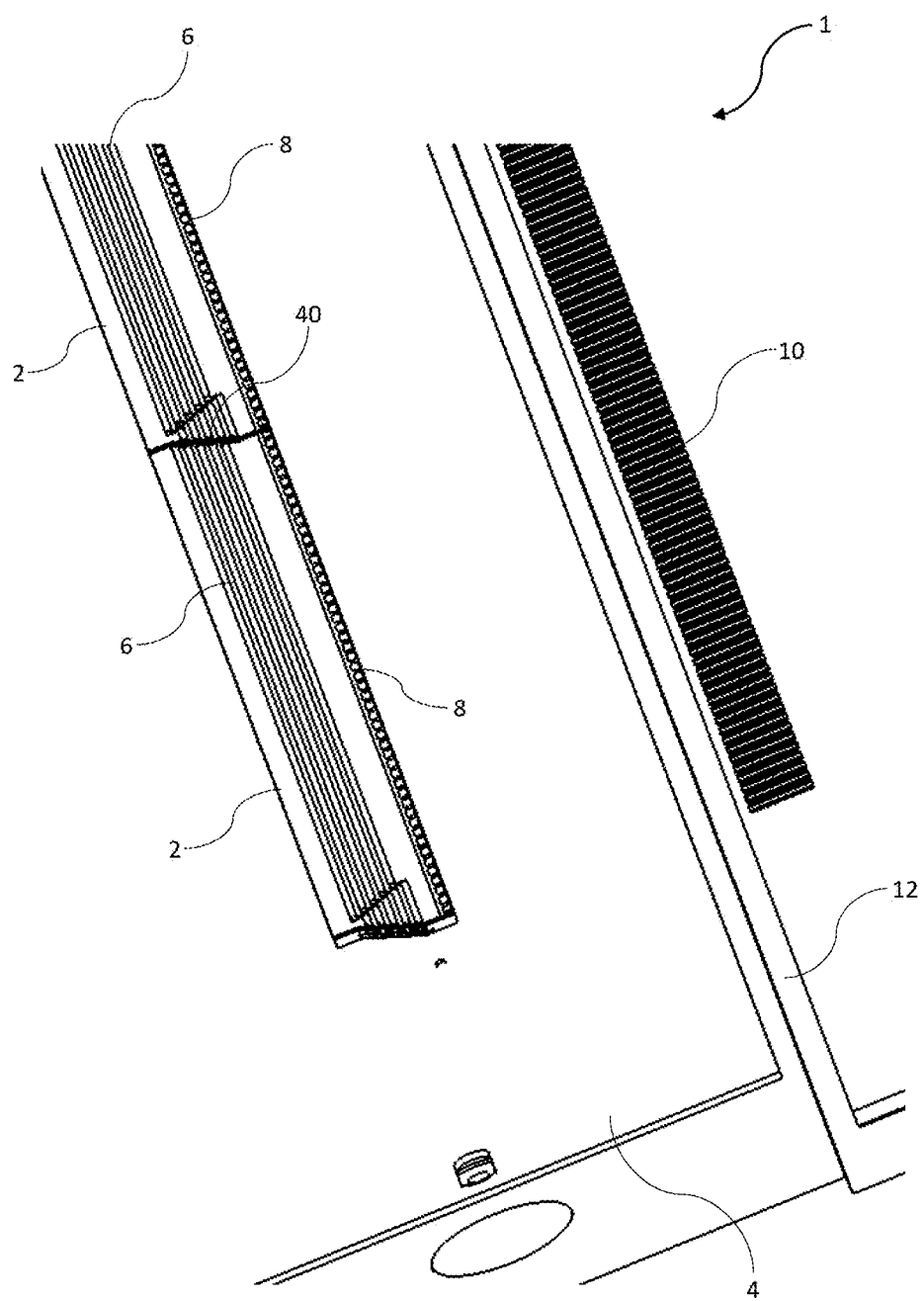
FIG. 1 is partial cutaway of a pagewide printhead assembly.

Referring to FIG. 1, there is shown part of a MEMS chip assembly in the form of an inkjet printhead assembly 1, as described in U.S. application Ser. No. 15/888,852. In the inkjet printhead assembly 1 shown in FIG. 1, wirebonds and encapsulant material have removed for clarity.

The printhead assembly 1 comprises a plurality of butting MEMS printhead chips 2 mounted on a surface of a supporting structure, which takes the form of a fluid manifold 4 for delivering ink to the printhead chips. Each printhead chip 2 has an active surface containing a plurality of MEMS inkjet nozzle devices 6, which are arranged in rows extending longitudinally along a length of the printhead assembly 1. A row of bond pads 8 are disposed in a row along one longitudinal edge region of each printhead chip 2. The bond pads 8 receive power and data signals from a row of electrical contacts 10 disposed on a PCB 12 positioned adjacent the printhead chips. Electrical connectors, such as wirebonds (not shown in FIG. 1) provide electrical connection between the contacts 10 and the bond pads 8, as known in the art. Further, a polymer encapsulant (not shown in FIG. 1) typically covers the electrical connectors to protect them during use.

Figure 2:
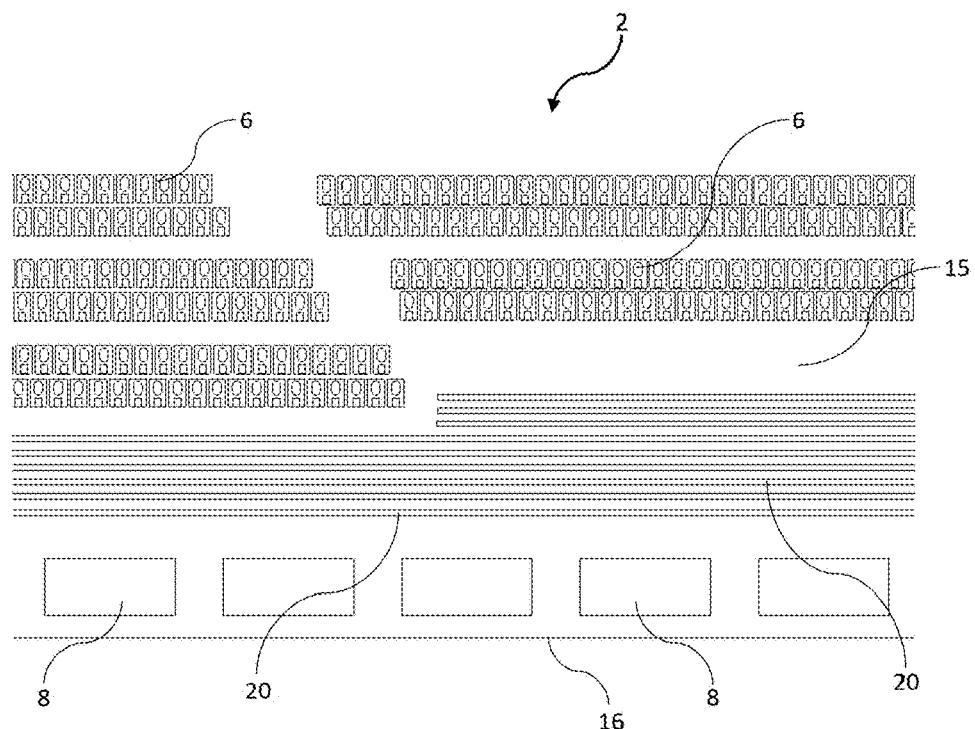
FIG. 2 is a plan view of part of a printhead chip according to one embodiment.
Figure 3:
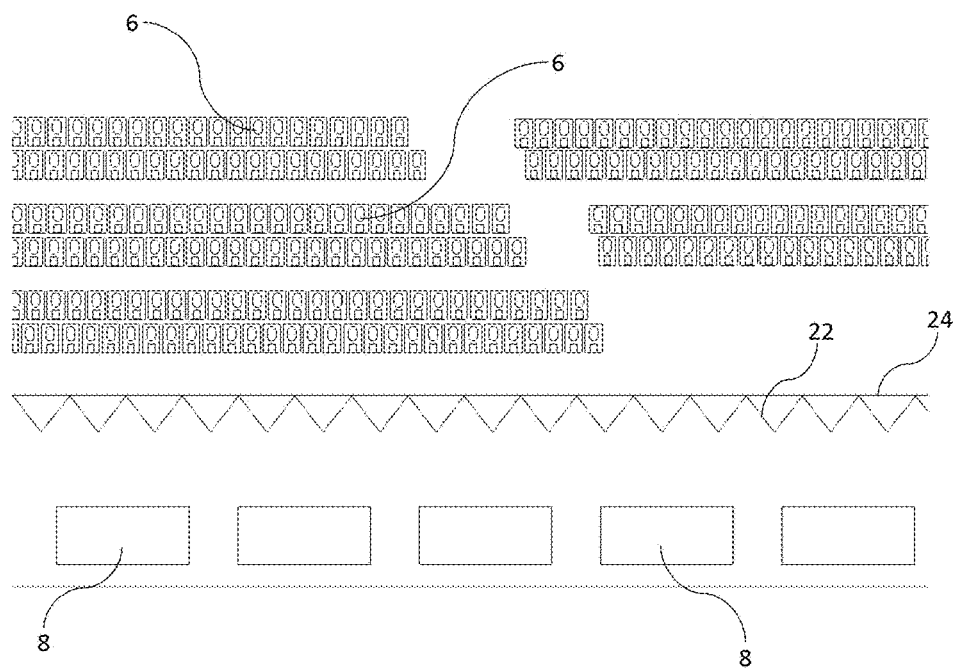
FIG. 3 is a plan view of part of a printhead chip according to an alternative embodiment.

FIG. 2 is a magnified plan view of part of the printhead chip 2 used in the printhead assembly 1. As shown in FIG. 2, a plurality of elongate encapsulant-retaining trenches 20 are defined in an active surface 15 of the printhead chip 2 containing the MEMS inkjet nozzle devices 6. The encapsulant-retaining trenches 20 extend along a length of the printhead chip 2 between the bond pads 8 and the MEMS inkjet nozzle devices 6. The encapsulant-retaining trenches 20 may be aligned in multiple rows and, as shown in FIG. 2, may be of unequal length in order to conform to the arrangement of MEMS inkjet nozzle devices 6. In the embodiment shown in FIG. 2, the encapsulant-retaining trenches 20 take the form of multiple linear rows extending parallel with a longitudinal edge 16 of the printhead chip 2. In an alternative embodiment shown in FIG. 3, encapsulant-retaining trenches between the MEMS inkjet nozzle devices 6 and the bond pads 8 take the form of a combination of a zig-zag encapsulant-retaining trench 22 and a linear encapsulant-retaining trench 24. It will be appreciated that any configuration of suitable encapsulant-retaining trenches may be employed in the present invention in accordance with the principles of controlling encapsulant movement, as will now be described in connection with FIG. 4.

Figure 4:
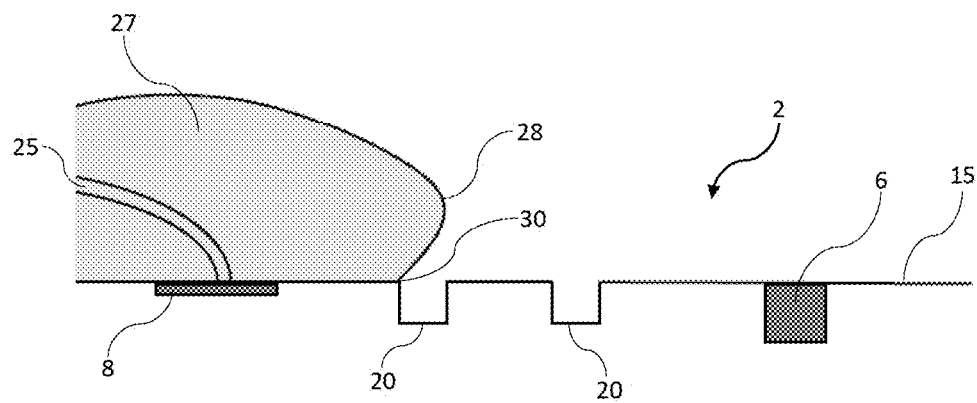
FIG. 4 is a schematic side view of a printhead assembly according to the invention with a bead of encapsulant protecting wirebonds.

Referring now to FIG. 4, there is shown a schematic sectional side view of the printhead chip 2 having an active surface 15 comprising one of the MEMS inkjet nozzle devices 6 and one of the bond pads 8. A wirebond 25 is bonded to the bond pad 8 and forms an electrical connection between the bond pad and one of the electrical contacts 10 (see FIG. 2) supplying power and/or data to the printhead chip 2. The wirebond 25 is covered by encapsulant 27, which extends along a length of the printhead chip 2 so as to protect and insulate all wirebonds connected to the chip. During manufacture, beads of liquid polymer encapsulant 27 are applied as a dispense line of material over the wirebonds using a suitable nozzle dispenser (not shown) before curing and hardening. Clearly, it is undesirable for the liquid polymer to spread across the active surface 15 and encroach on the MEMS inkjet nozzle devices 6 and the prior art contemplates the use of physical barriers (e.g. dams) to minimize such encroachment.

In the present invention, however, the encapsulant-retaining trench 20 serves to control spreading of the liquid encapsulant 27 by pinning an advancing front 28 of the encapsulant against a leading edge 30 of the encapsulant-retaining trench—that is, the edge of the encapsulant-retaining trench closest to the bond pad 8. As the meniscus of liquid encapsulant advances across the active surface 15 (left to right as shown in FIG. 4), the advancing dynamic contact angle between the liquid encapsulant and the active surface 15 experiences a sudden increase when the advancing front 28 reaches the leading edge 30 of the encapsulant-retaining trench 20. This increase in contact angle has the effect of pinning the advancing front 28 to the leading edge 30 and arresting the spread of liquid encapsulant past the encapsulant-retaining trench. Of course, once the liquid encapsulant is pinned and suitably positioned, then it is cured (e.g. via UV or thermal curing) so as to solidify the polymer and provide a robust protective coating for the wirebonds.

In the event that the force of the advancing front 28 is sufficient to overcome the pinning force resisting advancement, then multiple rows of encapsulant-retaining trenches 20 provide fallbacks to ensure that one of the leading edges 30 pins the advancing front 28 and resists its advancement. In practice, the fallback encapsulant-retaining trenches may not be required and the leading encapsulant-retaining trench 20 closest to the bond pads 8 is usually sufficient to control the spread of liquid encapsulant.

Significantly, it is the sharp angle (e.g. 90 degree angle) at the leading edge 30 of the encapsulant-retaining trench 20 in combination with the relative surface energies of the liquid encapsulant 27 and the active surface 15, which is responsible for inhibiting the spread of the encapsulant towards the MEMS inkjet nozzle devices 6. Notably, the encapsulant-retaining trenches 20 do not act simply as a moat for accommodating excess encapsulant and, therefore, have relatively small volumes. For example, each encapsulant-retaining trench may have a depth of less than 10 microns (e.g. 2 to 6 microns) and a width of less than 10 microns (e.g. 2 to 6 microns).

Encapsulant-retaining trenches having a small depth relative to the overall thickness of the printhead chip (which typically has depth of at least 150 microns) advantageously have minimal impact on the overall structural integrity of the printhead chip. A spacing between the linear encapsulant-retaining trenches 20 may be varied so as to maximize the structural integrity of the printhead chips. For example, the encapsulant-retaining trenches may be spaced apart by a distance of 3 to 20 microns or 10 to 15 microns.

A further advantage of the small volume of each encapsulant-retaining trench is the significant capillary pressure enabling liquid encapsulant to wick along the trench instead of advancing towards the MEMS inkjet nozzle devices 6.

Moreover, the encapsulant-retaining trenches 20 may be easily introduced as a late-stage etch into a MEMS process flow, in contrast with physical barriers as described in the prior art.

Figure 5:
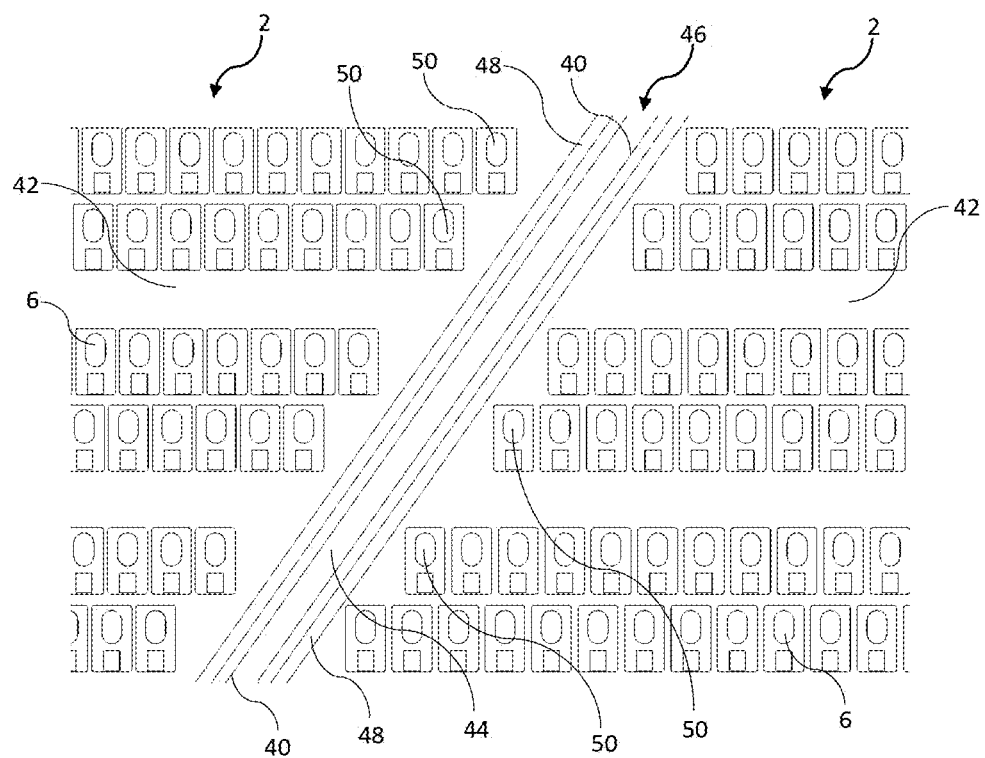
FIG. 5 is a plan view of join region of a pair of butting printhead chips.

Grouting between butting ends of printhead chips 2 may be improved by similar principles to those described above. Referring to FIG. 5, in a pagewide array of printhead chips 2 of the type where printhead chips are butted together in a line, it is usually necessary to grout between the butting edges 40 of neighboring printhead chips so as to avoid crevices on an ink ejection surface 42 of the printhead. Crevices between printhead chips 2 are undesirable, because they may trap ink and/or particulates during use and reduce the efficacy of printhead wiping, ultimately resulting in reduced print quality.

During printhead fabrication, a grout material 44, in the form a curable liquid polymer, is introduced a gap 46 between neighboring printhead chips. Typically, the grout material 44 is a relatively non-viscous liquid (compared to the encapsulant material) and flows into the gaps after being dispensed onto a longitudinal edge of the printhead chips 2 opposite the bond pads. The advancing liquid grout material 44 and the advancing encapsulant material 27 are similarly problematic insofar as any encroachment onto the MEMS inkjet nozzle devices 6 will result in catastrophic failure of devices and a reduction in printhead yields. By analogy with the encapsulant-retaining trenches 20 described above, and referring to FIG. 5, grouting trenches 48 are defined in the ink ejection surface 42 of the printhead chip 2 between an endmost nozzle 50 of each nozzle row and a butting edge 40 of the printhead chip. In this way, the grouting trench 48 serves to arrest an advancing front of the grouting material 44 and protects the MEMS inkjet nozzles devices 6 from damage by the grouting material.

Typically, a distance between each endmost nozzle 50 and the butting edge 40 is less than 50 microns or less than 25 microns; therefore, only one grouting trench 48 may be accommodated in the available area. Nevertheless, the single grouting trench 48 is still highly effective in holding back the grout material 44 from MEMS inkjet nozzle devices 6. The dimensions and configuration of the grouting trenches 48 may be similar to the encapsulant-retaining trenches 20, as described above.

From the foregoing, it will be appreciated that the use of trenches on a chip surface minimizes the spread of liquid polymer across the chip onto sensitive MEMS devices. The present invention, therefore aids in the miniaturization of chips and, furthermore, minimizes "dead space" on the chip surface.

It will, of course, be appreciated that the present invention has been described by way of example only and that modifications of detail may be made within the scope of the invention, which is defined in the accompanying claims.

The invention claimed is:

1. A MEMS chip assembly comprising:
    a support structure having a chip mounting surface;
    a MEMS chip mounted on the chip mounting surface, each MEMS chip having an active surface including one or more rows of MEMS devices and a row of bond pads disposed alongside a connection edge of the MEMS chip and parallel with the rows of MEMS devices;
    electrical connectors connected to the bond pads; and
    an encapsulant material covering the electrical connectors,
    wherein:
    the MEMS chip has multiple rows of encapsulant-retaining trenches defined in the active surface;
    the multiple rows of encapsulant-retaining trenches extend parallel with the rows of MEMS devices;
    a distance between neighboring encapsulant-retaining trenches is greater than a width of each encapsulant-retaining trench;
    the multiple rows of encapsulant-retaining trenches are disposed between the bond pads and the MEMS devices; and
    the encapsulant material does not encroach past the encapsulant-retaining trenches towards the MEMS devices.

2. The MEMS chip assembly of claim 1, wherein the electrical connectors comprise wirebonds or TAB connections.

3. The MEMS chip assembly of claim 1, wherein the rows of encapsulant-retaining trenches extend parallel with the connection edge.

4. The MEMS chip assembly of claim 1, wherein each encapsulant-retaining trench has a depth in the range of 2 to 10 microns and a width in the range of 2 to 20 microns.

5. The MEMS chip assembly of claim 1, wherein each encapsulant-retaining trench has a rectangular profile in cross-section.

6. The MEMS chip assembly of claim 1, wherein the encapsulant material is a polymer applied as a liquid during encapsulation.

7. The MEMS chip assembly of claim 1, wherein the MEMS devices are inkjet nozzle devices and the support structure is a fluid manifold for delivering ink to the inkjet nozzle devices.

8. A MEMS chip comprising a substrate having an active surface, the active surface including:
    a plurality of rows of MEMS devices; and
    a row of bond pads arranged alongside a connection edge of the substrate and parallel with the rows of MEMS devices; and
    wherein:
    the MEMS chip has multiple rows of encapsulant-retaining trenches defined in the active surface;
    the multiple rows of encapsulant-retaining trenches extend parallel with the rows of MEMS devices;
    a distance between neighboring encapsulant-retaining trenches is greater than a width of each encapsulant-retaining trench; and
    the multiple rows of encapsulant-retaining trenches are disposed between the bond pads and the MEMS devices.

9. The MEMS chip of claim 8, wherein the rows of encapsulant-retaining trenches extend parallel with the connection edge.

10. The MEMS chip of claim 8, wherein each encapsulant-retaining trench has a depth in the range of 2 to 10 microns and a width in the range of 2 to 20 microns.

11. The MEMS chip of claim 8, wherein the MEMS devices are inkjet nozzle devices.

12. A method of fabricating a MEMS chip assembly, said method comprising the steps of:
- mounting a MEMS chip according to claim 8 to a chip mounting surface of a support structure;
- connecting electrical connectors to the row of bond pads;
- applying one or more beads of liquid encapsulant material over the electrical connectors;
- pinning an advancing liquid front of the encapsulant material at an edge of one of the encapsulant-retaining trenches defined in the active surface; and
- curing the encapsulant material.

13. The method of claim 12, wherein the multiple encapsulant-retaining trenches minimize encroachment of the encapsulant material onto the MEMS devices.

14. The method of claim 12, wherein the encapsulant material is a liquid polymer.

15. The method of claim 12, wherein the rows of encapsulant-retaining trenches extends parallel with a longitudinal edge of the MEMS chip.

16. The method of claim 12, wherein the MEMS chip is a printhead chip and the MEMS chip assembly is an inkjet printhead.

\* \* \* \* \*